(12) United States Patent
Rangarajan et al.

(10) Patent No.: US 8,018,293 B2
(45) Date of Patent: Sep. 13, 2011

(54) CONFIGURABLE WIDE TUNING RANGE OSCILLATOR CORE

(75) Inventors: Rajagopalan Rangarajan, San Diego, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 56 days.

(21) Appl. No.: 12/486,607

(22) Filed: Jun. 17, 2009

(65) Prior Publication Data

US 2010/0321124 A1 Dec. 23, 2010

(51) Int. Cl.
*H03B 5/08* (2006.01)
(52) U.S. Cl. .................. 331/117 FE; 331/167
(58) Field of Classification Search ............. 331/117 FE
See application file for complete search history.

(56) References Cited

U.S. PATENT DOCUMENTS

| | | | | |
|---|---|---|---|---|
| 6,987,425 | B1 * | 1/2006 | Sutardja ................. | 331/117 R |
| 7,218,182 | B2 * | 5/2007 | Muramatsu ............... | 331/177 V |
| 7,423,495 | B2 | 9/2008 | Bevilacqua et al. | |
| 7,463,106 | B2 * | 12/2008 | Shin et al. .................... | 331/167 |

FOREIGN PATENT DOCUMENTS

| | | |
|---|---|---|
| GB | 2442034 | 3/2008 |
| WO | WO03088497 A1 | 10/2003 |

OTHER PUBLICATIONS

Hauspie, E.-C Park and J. Craninckx, "Wideband VCO With Simultaneous Switching of Frequency Band, Active Core and Varactor Size," IEEE J. of Solid State Circuits, vol. 42, No. 7, Jul. 2007.

Andreani P: "A low-phase-noise low-phase-error 1.8GHz quadrature CMOS VCO" Solid-State Circuits Conference, 2002. Digest of Technical Papers. 2002 IEEE International Feb. 3-7, 2002, Piscataway, NJ, USA,IEEE, vol. 2, Feb. 3, 2002, pp. 228-229, XP010585038 ISBN: 978-0-7803-7335-8 the whole document.
Hui Gao, et al: "Design of Low-Phase-Noise Low-Phase-Error CMOS Quadrature VCO" Microwave and Millimeter Wave Technology, 2007. ICMMT '07. International Conference ON, IEEE, PI, Apr. 1, 2007, pp. 1-4, XP031112853 ISBN: 978-1-4244-1048-4 p. 1, right-hand column, line 11 - p. 2, right-hand column, line 4; figures 1,2.
International Search Report and Written Opinion - PCT/US2010/039089, International Search Authority - European Patent Office - Oct. 5, 2010.
S-L Jang, et al: "LC-Tank Colpitts Injection-Locked Frequency Divider With Record Locking Range" IEEE Microwave and Wireless Components Letters, IEEE Service Center, New York, NY, US LNKD-DOI: 10.1109/LMWC.2008.2001023, vol. 18, No. 8, Aug. 1, 2008, pp. 560-562, XP011232400 ISSN:1531-1309*abstract; figure 1.

(Continued)

*Primary Examiner* — Joseph Chang
(74) *Attorney, Agent, or Firm* — Jiayu Xu

(57) ABSTRACT

An oscillator includes a resonator, a first and a second p-type transistor, and a first and a second n-type transistor. The resonator has a first terminal and a second terminal. The first p-type transistor is switchably connected to the first terminal while the second p-type transistor is switchably connected to the second terminal. A first drain of the first n-type transistor and the second drain of the second n-type transistor are electrically connected to the first terminal and the second terminal, respectively. The oscillator is capable of operating in an NMOS only mode and in a CMOS mode.

27 Claims, 7 Drawing Sheets

OTHER PUBLICATIONS

Tien-Ling Hsieh, et al: "A Reconfigurable Oscillator Topology for Dual-Band Operation" VLSI Design, 2005. 18th International Conference on Kolkata, India Jan. 3-7, 2005, Piscataway, NJ, USA,IEEE LNKDDOI: 10.1109/ICVD.2005.31, Jan. 3, 2005, pp. 870-873, XP010769953 ISBN: 978-0-7695-2264-7 p. 1, right-hand column, line 13 - p. 4, left-hand column, line 2; figures 1,2.

Zahra Safarian, et al: "A 1.3a 6 GHz triple-mode CMOS VCO using coupled inductors" Custom Integrated Circuits Conference, 2008. CICC 2008. IEEE, IEEE, Piscataway, NJ, USA, Sep. 21, 2008, pp. 69-72, XP031361414 ISBN: 978-1-4244-2018-6 the whole document.

* cited by examiner

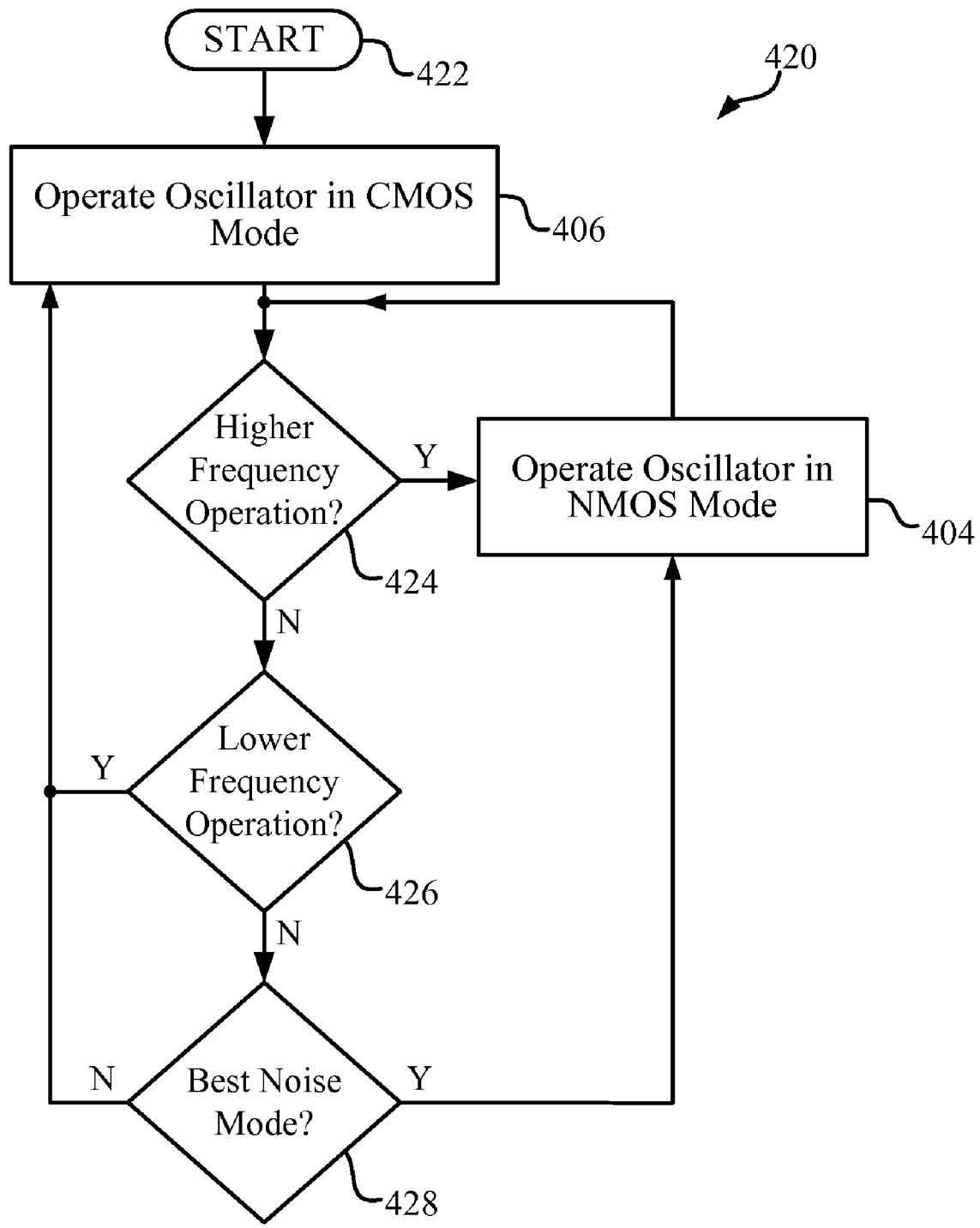

CONFIGURABLE WIDE TUNING RANGE OSCILLATOR CORE

BACKGROUND

1. Field

This invention is generally related to oscillators, and more particularly, to configurable wide tuning range oscillators.

2. Background

Oscillators may be used in a variety of communication systems, including radio frequency (RF) systems and other wireless communication systems. Within the variety of communication systems, oscillators may be used in transmitter and receiver circuits. Two common types of oscillators are the voltage controlled oscillator (VCO) and the digital controlled oscillator (DCO).

Evolving technologies and industry standards related to wireless communication systems have led to a need for more flexible and efficient oscillators. The standards lead to varying requirements for phase noise and oscillator amplitude. A highly configurable oscillator is desired to optimize performance of wireless communication systems operated pursuant to the standards. Efficiency considerations include minimizing oscillator current consumption in order to increase talk time, and the flexibility to cover multiple frequency bands.

Past attempts at such configurable oscillators include: (a) providing multiple oscillators wherein each oscillator covers a small portion of the overall frequency range, and wherein each oscillator is optimized for a certain standard in terms of power and phase noise; (b) providing a single oscillator combined with multiple divisions and mixing to generate an array of frequencies; (c) providing transformer based oscillators, for example, as discussed in U.S. Pat. No. 7,423,495, issued to Bevilacqua, et al., on Sep. 9, 2008 and titled, "Oscillator and Method for Generating an Oscillator Signal," which is entirely incorporated by reference herein; and (d) providing multiple active cores of varying size switched in and out of one LC tank to cover a wide tuning range, as discussed by D. Hauspie, et al., in "Wideband VCO with simultaneous switching of frequency band, active core and varactor size," IEEE J. of Solid State Circuits, vol. 42, no. 7, Jul. 2007, which is entirely incorporated by reference herein.

Providing multiple oscillators wherein each oscillator covers a small portion of the overall frequency range may require a large area devoted to the oscillator system due to the use of numerous inductors. For example, at least one inductor may be required for each oscillator.

Providing a single oscillator combined with multiple divisions and mixing to generate an array of frequencies may result in excessive power consumption and a reduction in programming flexibility in terms of power and phase noise. In addition, there may be undesired spurs due to the multiple stages of mixing.

Providing transformer based oscillators may require a transformer with a large magnetic coupling (k factor) which may be difficult to realize, and on chip implementations generally result in a lower Q.

Providing multiple active cores of varying size switched in and out of one LC tank to cover a wide tuning range may result in an increase in current consumption at the lower end of the frequency tuning range as further components are switched in.

While various techniques have been attempted for more efficiently meeting varying requirements for phase noise and oscillator amplitude, the known techniques do not provide an optimum solution for a configurable wide tuning range oscillator and may include undesirable limitations. A need exists for better techniques for more efficiently meeting varying requirements for phase noise and oscillator amplitude in wireless communication systems.

SUMMARY

Disclosed herein is a new and improved configurable wide tuning range oscillator.

In accordance with an aspect, an apparatus includes a resonator having a first terminal and a second terminal, a first p-type transistor having a first source, a first gate, and a first drain, the first gate electrically connected to the second terminal, and the first drain electrically connected to the first terminal through a first switch, a second p-type transistor having a second source, a second gate, and a second drain, the second source electrically connected to the first source, the second gate electrically connected to the first terminal, and the second drain electrically connected to the second terminal through a second switch, a first n-type transistor having a third source, a third gate, and a third drain, the third gate electrically connected to the second terminal, the third drain electrically connected to the first terminal through a first connection that does not include a switch, and a second n-type transistor having a fourth source, a fourth gate, and a fourth drain, the fourth gate connected to the first terminal, the fourth drain electrically connected to the second terminal through a second connection that does not include a switch, and the fourth source electrically connected to the third source.

In accordance with another aspect, an apparatus includes a resonator having a first terminal and a second terminal, a first p-type transistor having a first source, a first gate, and a first drain, the first gate electrically connected to the second terminal, and the first drain electrically connected to the first terminal, a second p-type transistor having a second source, a second gate, and a second drain, the second source electrically connected to the first source, the second gate electrically connected to the first terminal, and the second drain electrically connected to the second terminal, a first n-type transistor having a third source, a third gate, and a third drain, the third gate electrically connected to the second terminal, the third drain electrically connected to the first terminal through a first switch, and a second n-type transistor having a fourth source, a fourth gate, and a fourth drain, the fourth gate electrically connected to the first terminal, the fourth drain electrically connected to the second terminal through a second switch, and the fourth source electrically connected to the third source, wherein the fourth source and the third source are electrically connected to ground through a third switch.

In accordance with another aspect, a method of operating an oscillator having a resonator, comprising, operating the oscillator with two p-type transistors inactive and two n-type transistors active when the oscillator is called upon to produce frequencies in a higher range, and operating the oscillator with the two p-type transistors active and the two n-type transistors active when the oscillator is called upon to produce frequencies in a lower range, wherein the first of the two p-type transistors has a first drain, and the second of the two p-type transistors has a second drain, and the first drain is disconnected from a first terminal of the resonator when the first p-type transistor is inactive, and the second drain is disconnected from a second terminal of the resonator when the second p-type transistor is inactive.

In accordance with a further aspect, an apparatus, comprising means for operating two n-type transistors and two p-type transistors as active components in an oscillator when the oscillator is called upon to produce frequencies in a lower frequency range, means for operating the two n-type transistors as active components while the p-type transistors are disconnected from a resonator of the oscillator when the oscillator is called upon to produce frequencies in a higher frequency range, and means for operating the two n-type transistors as active components while the p-type transistors are disconnected from the resonator when the oscillator is called upon to minimize phase noise while producing frequencies in the lower frequency range.

Other systems, methods, aspects, features, embodiments and advantages of the improved techniques for more efficiently meeting varying requirements for phase noise and oscillator amplitude disclosed herein will be, or will become, apparent to one having ordinary skill in the art upon examination of the following drawings and detailed description. It is intended that all such additional systems, methods, aspects, features, embodiments and advantages be included within this description, and be within the scope of the accompanying claims.

BRIEF DESCRIPTION OF THE DRAWINGS

It is to be understood that the drawings are solely for purpose of illustration. Furthermore, the components in the figures are not necessarily to scale, emphasis instead being placed upon illustrating the principles of the apparatus and methods disclosed herein. In the figures, like reference numerals designate corresponding parts throughout the different views.

FIG. 4B is a flow chart illustrating another exemplary method of operating a DCO, for example DCOs of FIGS. 1A, 1B, and 1C.

DETAILED DESCRIPTION

The following detailed description, which references to and incorporates the drawings, describes and illustrates one or more specific embodiments. These embodiments, offered not to limit but only to exemplify and teach, are shown and described in sufficient detail to enable those skilled in the art to practice what is claimed. Thus, for the sake of brevity, the description may omit certain information known to those of skill in the art.

The word "exemplary" is used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the appended claims.

Figure 1A:
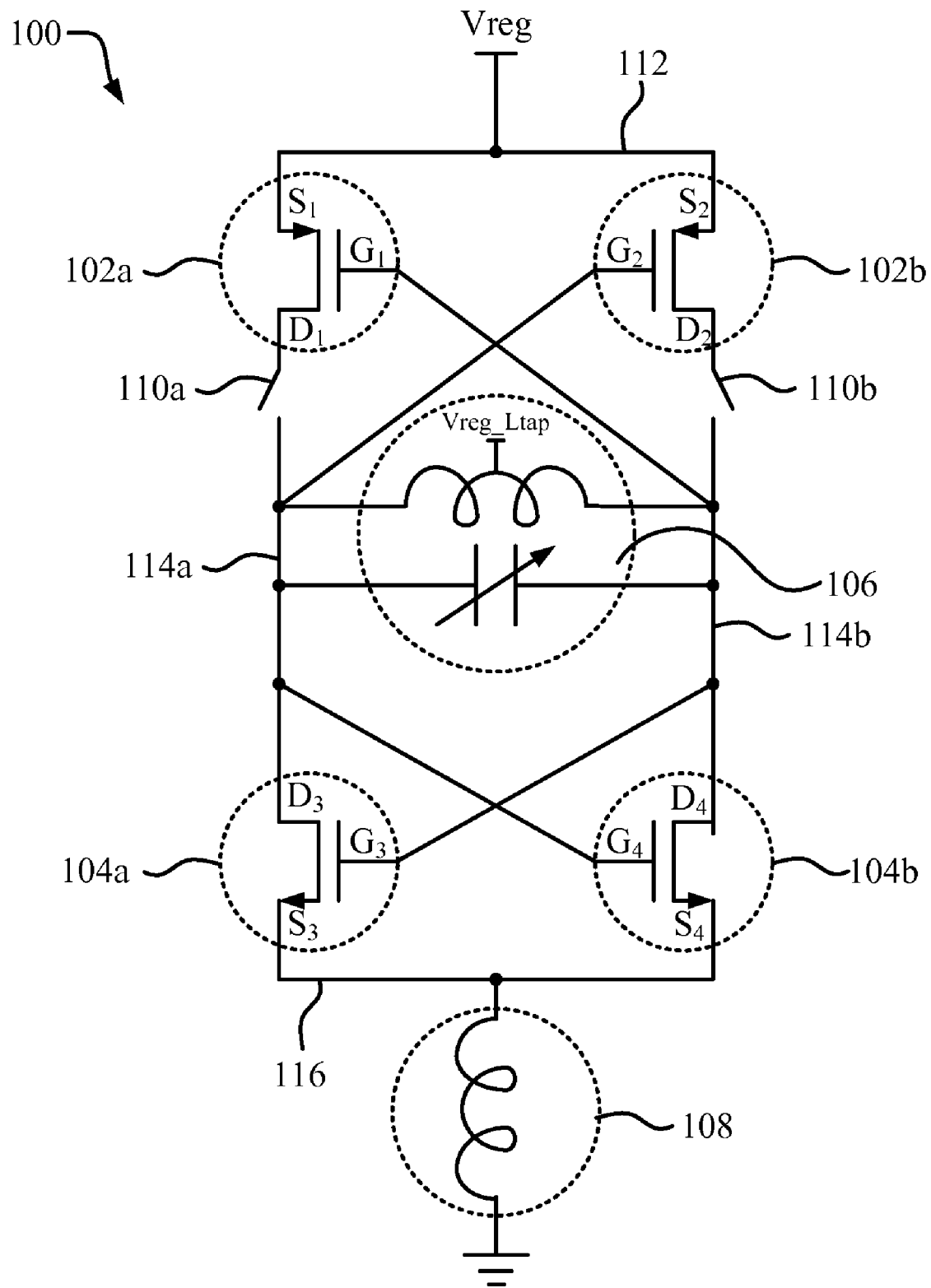
FIG. 1A is a schematic diagram of an exemplary digital controlled oscillator (DCO).

FIG. 1A shows an exemplary digitally controlled oscillator (DCO) 100 that includes a first p-type transistor 102a, a second p-type transistor 102b, a first n-type transistor 104a, a second n-type transistor 104b, a resonator 106, an inductor 108, a first switch 110a, and a second switch 110b. A regulating voltage, Vreg, is applied to line 112. The oscillator 100 may be employed in a large number of devices, such as but not limited to cellular and wireless integrated circuits that may require wide tuning range oscillators with power saving options. The oscillator 100 illustrates an embodiment that is operated in a complementary metal-oxide-semiconductor (CMOS) band 304, a negative-channel metal-oxide-semiconductor (NMOS) band 308, and an NMOS/CMOS band 306 (see FIG. 3).

The resonator 106 has a first terminal connected to a line 114a, and a second terminal connected to a line 114b. The first p-type transistor 102a has a first source $S_1$ connected to the line 112, a first gate $G_1$ connected to the line 114b, and a first drain $D_1$ switchably electrically connected to the line 114a through the first switch 110a. The second p-type transistor 102b has a second source $S_2$ connected to the line 112, a second gate $G_2$ connected to the line 114a, and a second drain $D_2$ switchably electrically connected to the line 114b through the second switch 110b.

The first n-type transistor 104a has a third source $S_3$ connected to a line 116, a third gate $G_3$ connected to the line 114b, and a third drain $D_3$ connected to the line 114a. In the example of FIG. 1A, the third drain $D_3$ is electrically connected to the line 114a in a manner that does not include a switch. The second n-type transistor 104b has a fourth source $S_4$ connected to the line 116, a fourth gate $G_4$ connected to the line 114a, and a fourth drain $D_4$ connected to the line 114b. In the example of FIG. 1A, the fourth drain $D_4$ is electrically connected to the line 114b in a manner that does not include a switch.

For purposes of illustration, the resonator 106 is an LC tank having variable capacitance in parallel with an inductor. The resonator 106 inductor is shown with a voltage regulation tap, Vreg_Ltap, at approximately the center. In other circumstances, the resonator 106 may be a number of other resonators known to those having ordinary skill in the art, such as but not limited to, LC tanks having banks of switched capacitors, continuously tunable varactors, combinations of banks of switched capacitors and tunable varactors, single inductors, switched inductors, transformers with multiple ports having capacitors on one or more of the ports, and a transformer based resonator. The line 112 receives the regulating voltage Vreg. For the example of FIG. 1A, the line 116 is connected to ground through the inductor 108. In some situations, the inductor 108 may be omitted. In other circumstances, other devices may be used to electrically connect the line 116 to ground.

To configure the core in the CMOS mode, switch 110A and switch 110B are closed and therefore "ON". The bias for the CMOS core is fed through the node Vreg. In this confirguation, the Vreg_ltap node remains unconnected or "floating", Under this condition, the full parasitic capacitance of the PMOS transistors (102a 102b) appears across the resonator tank 106 which lowers the frequency. Since the CMOS core has intrinsically better current consumption, and because the parasitic capacitance appearing across the resonator tank is larger, the lower end of the frequency tuning range is extended while current consumption is reduced. To configure the core in the "NMOS only" mode, switch 110A and switch 110B are opened or "OFF". By disconnecting these switches, the parasitic capacitance from the drain of the PMOS transistors 102a and 102b to the resonating tank 106 is minimized. The node Vreg (112) is pulled to ground. In some circumstances, Vreg may be left floating or connected to the Vdd in the "NMOS only" mode. The bias for the NMOS transistors 104a and 104b is supplied through the Vreg_ltap node. Since the tank 106 can swing as large as 2*Vreg_ltap under this condition, as compared to Vreg in the CMOS case (and Vreg_ltap can be the same value in the NMOS case as Vreg is in the CMOS case) phase noise can be lower than in the CMOS case. Thus, the NMOS only mode can achieve higher frequency and lower phase noise than the CMOS case at the expense of current. In circumstances where minimizing phase noise is not ciritcal, the voltage Vreg_ltap can be lowered to lower the headroom, while the advantage of higher frequency tuning range is still retained.

Figure 1B:
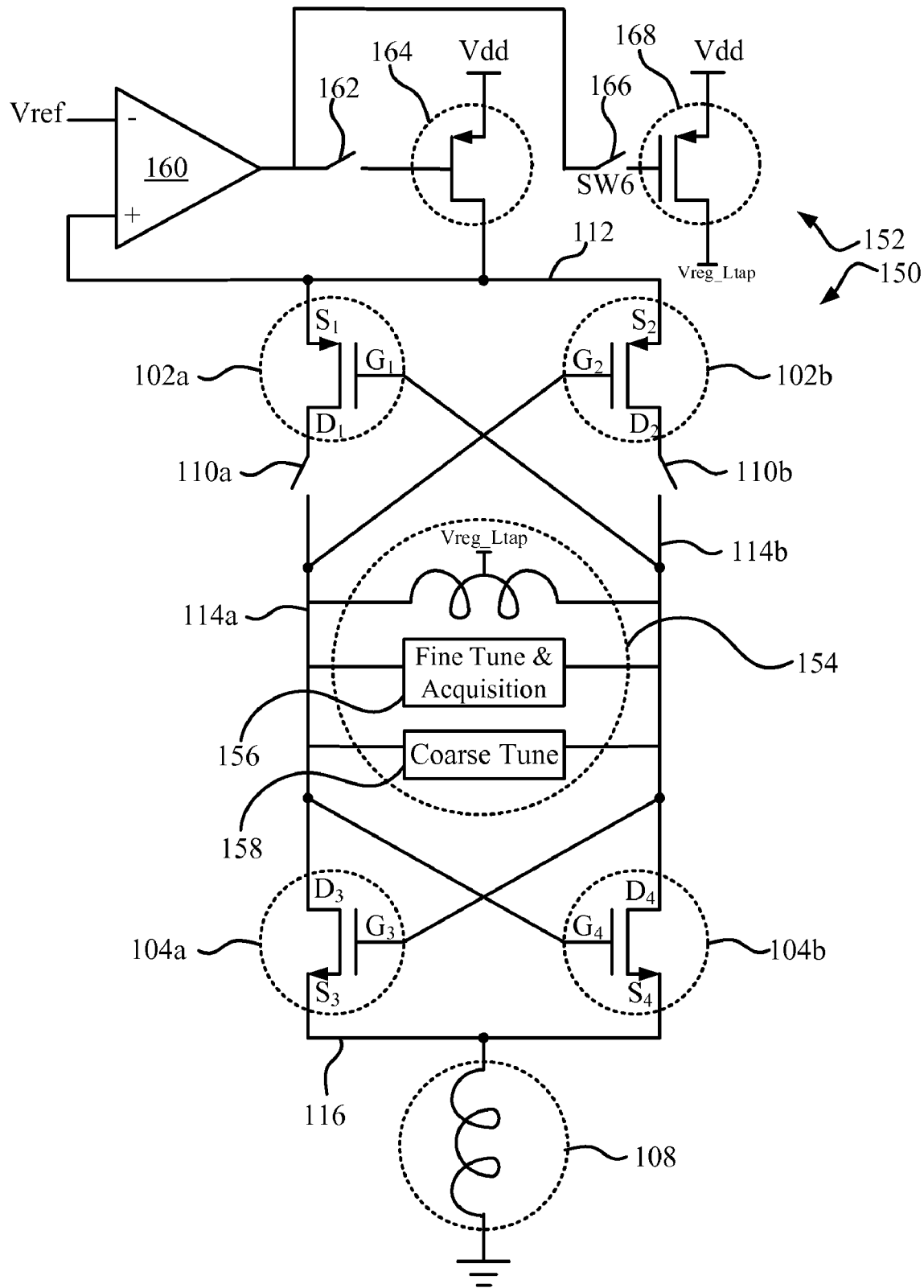
FIG. 1B is a schematic diagram of another exemplary DCO and a biasing system for a DCO.

FIG. 1B shows a second exemplary oscillator 150 and a biasing system 152 for the oscillator 150. The oscillator 150 includes components discussed in regard to the oscillator 100, and a resonator 154. The resonator 154 includes a fine tune and acquisition variable capacitor portion 156 and a coarse tuning portion 158. The biasing system 152 includes an operational amplifier 160, a switch 162, a transistor 164, a switch 166, and a transistor 168.

In the example of FIG. 1B, the reference voltage, Vref, is provided to the inverting input of the operational amplifier 160 and the line 112 may be the non-inverting input of the operational amplifier 160. In other embodiments, a voltage regulation tap, Vreg_Ltap, may be provided as the non-inverting input of the operational amplifier 160.

In the oscillator 150, the switches 110a and 110b may carry DC current. Since the source of the switches 110a and 110b may not be at ground, there may be greater capacitance to close. In the example of FIG. 1B, the first switch 110a and the second switch 110b are NMOS switches. In other embodiments, the switches 110a and 110b may be a number of switches known to those having ordinary skill in the art, such as but not limited to p-type metal-oxide-semiconductor (PMOS), microelectromechanical systems (MEMS), heterojunction bipolar transistor (HBT), and may be of the type illustrated in FIG. 2.

Operation of the core circuit shown in FIG. 1B is in accordance with the operation of the circuit of FIG. 1A. In addition, the biasing circuit 152 shown in FIG. 1B provides one example of a technique for maintaining the appropriate biasing levels. In the CMOS mode, switch 110a, switch 110b and switch 162 are closed and switch 166 is open to place the voltage of the gate of transistor 168 to Vdd. As a result, the node Vreg_ltap is floating as required for the CMOS mode. The operational amplifier 160 ensures that node 112 stays at Vref.

For the NMOS only mode, switch 110a, switch 110b and switch 162 are open. The gate of transistor 164 is pulled to Vdd. In this case, node 112 (Vreg) is left floating. Switch 166 is also closed. The non-inverting terminal of operational amplifier 160 is connected to Vreg_ltap, through another set of switches (not shown). The operational amplifier 160 in this configuration ensures that Vreg_ltap stays at voltage Vref.

Figure 1C:
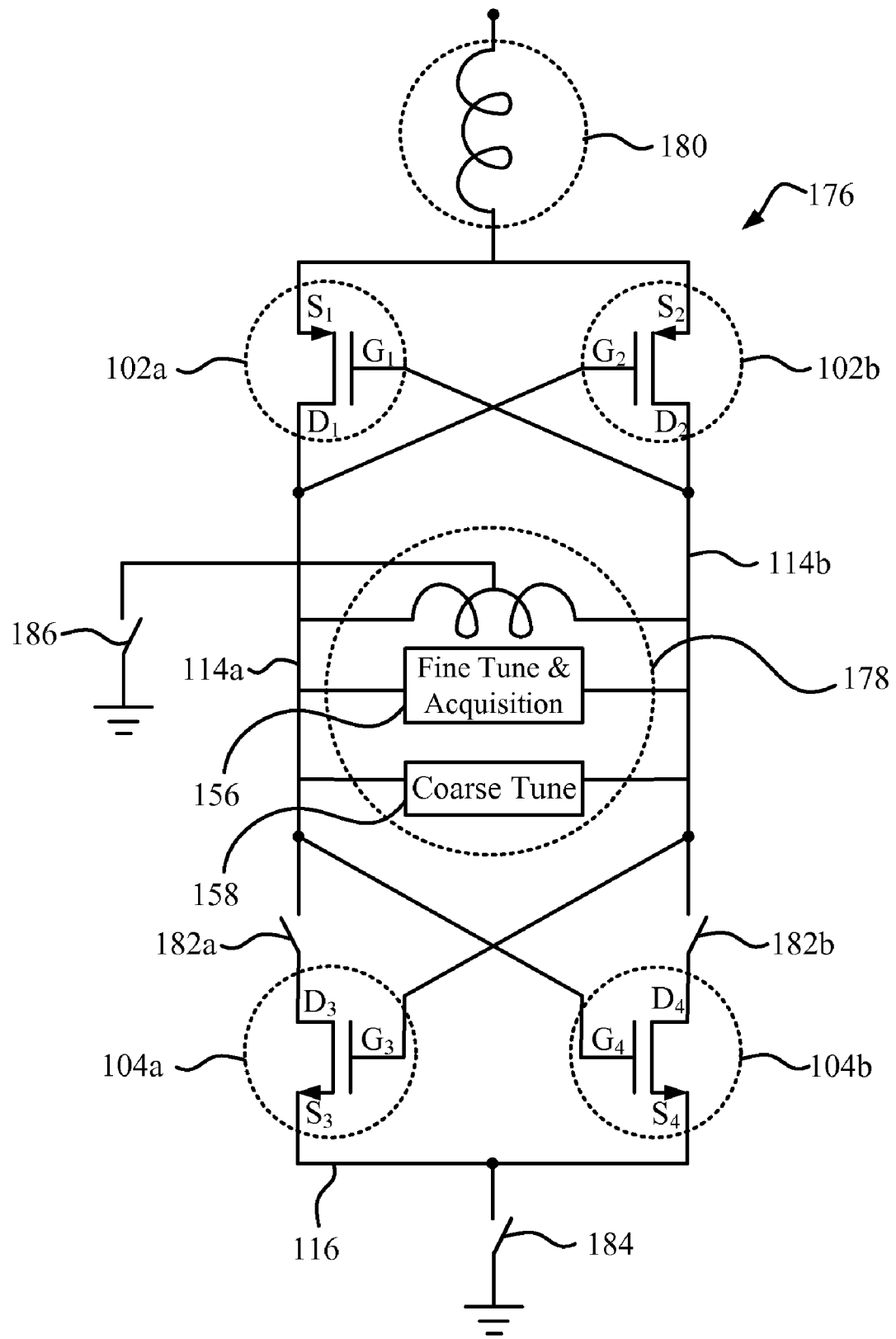
FIG. 1C is a schematic diagram of a further exemplary DCO.

FIG. 1C shows a third exemplary oscillator 176. The oscillator 176 includes components discussed in regard to the oscillator 100, a resonator 178, an inductor 180, a switch 182a, a switch 182b, a switch 184, and a switch 186. The oscillator 176 illustrates an embodiment that is suitable for operation in a PMOS mode, among other operating modes.

FIG. 1C shows an implementation to achieve a PMOS only mode and a CMOS mode. The CMOS mode operation of the core circuit shown in FIG. 1C is in accordance with the operation discussed above with reference to FIG. 1A. Switch 182a, switch 182b and switch 184 are closed and switch 186 is left open. In the PMOS mode, switch 186 is closed and switches 182a, 182b and 184 are left open.

Figure 2:
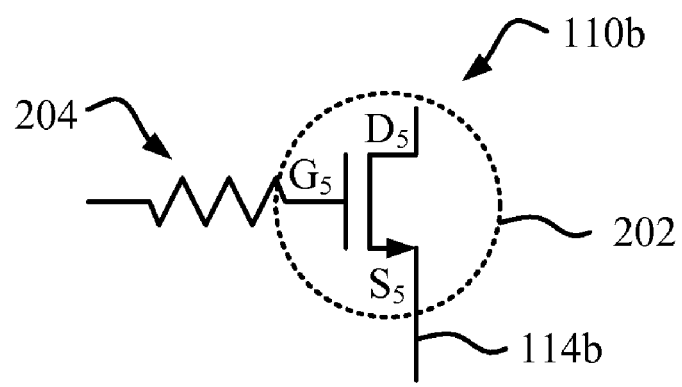
FIG. 2 is a schematic diagram of a switch that may be employed in the DCOs of FIGS. 1A, 1B, and 1C.

FIG. 2 is a schematic diagram of a switch 110b that may be employed in the DCOs of FIGS. 1A, 1B, and 1C. The exemplary switch 110b in FIG. 2 includes a transistor 202 and a resistor 204. Use of the resistor 204 may reduce noise from a bias voltage driving the gate of the transistor 202. The resistor 204 may allow the gate voltage of transistor 202 to maintain a proportional response to the source/drain voltage of the transistor 202 when the switch 110b is ON, thereby maintaining ON resistance of the switch 110b.

Figure 3:
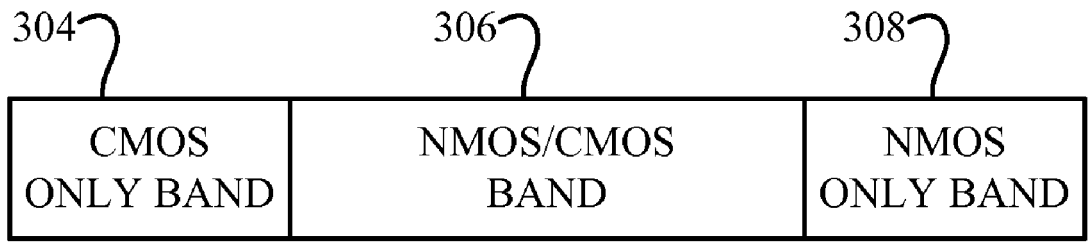
FIG. 3 is a band diagram illustrating operating bands associated with DCOs of FIGS. 1A, 1B, and 1C.
Figure 3:

FIG. 3 is a graphical illustration of an oscillator tuning range 302 achievable with the oscillators such as those shown in FIGS. 1A and 1B. The oscillator tuning range 302 includes the CMOS band 302, the NMOS/CMOS band 304, and the NMOS band 306. The bands 302, 304, and 306 include a plurality of channels. The CMOS band 302 includes a lower end of the frequency tuning range, while the NMOS band 306 includes a higher end of the frequency tuning range. The NMOS/CMOS band 304 may allow operation in NMOS mode where phase noise reduction is desired, while CMOS mode is allowed where lower power consumption is desired.

In some embodiments and under some conditions, it may be desirable to operate the oscillators 100, 150, and 176 in the CMOS only mode, the NMOS only mode, and the PMOS only mode, while allowing operating in other modes as conditions and requirements change.

Figure 4A:
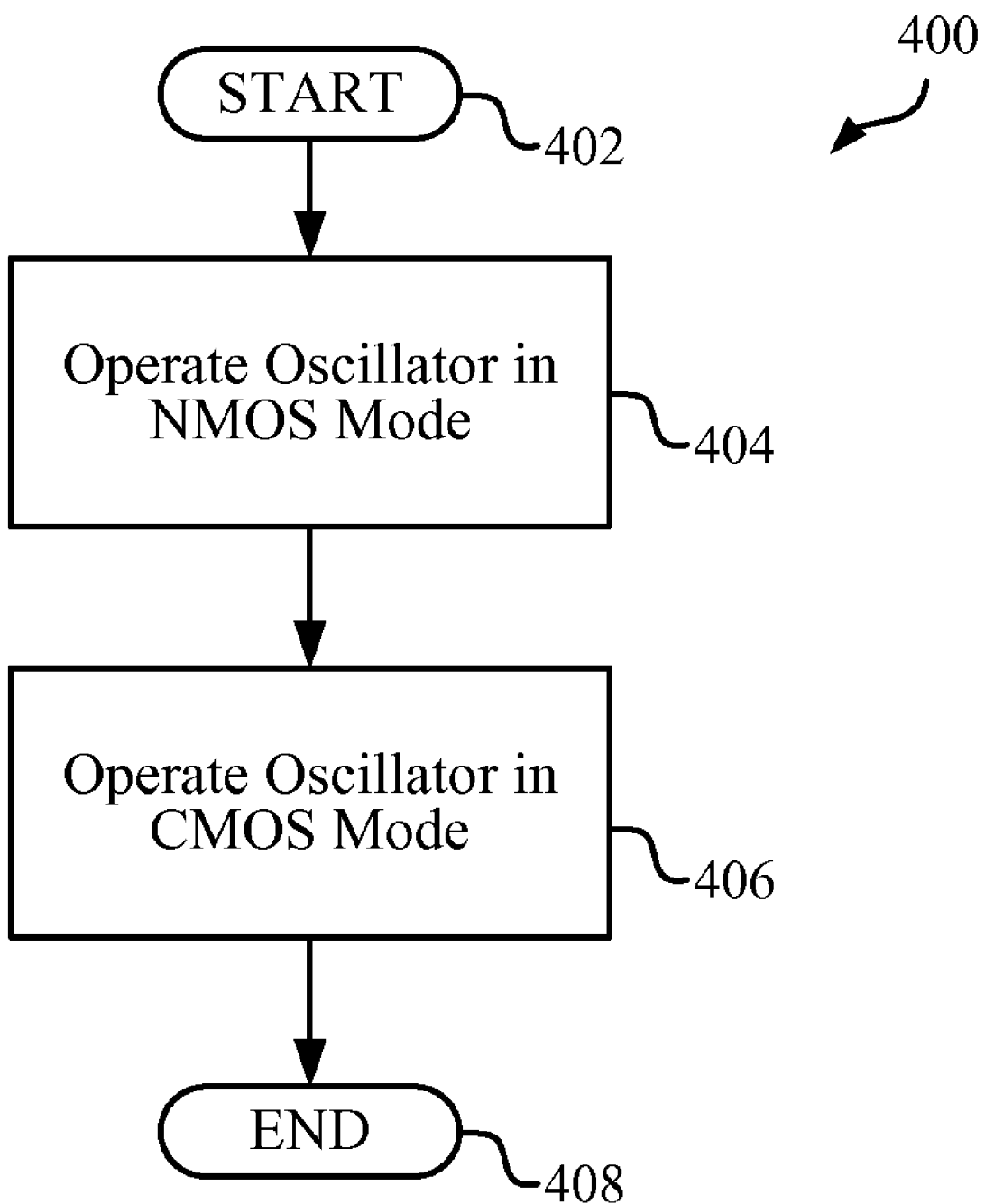
FIG. 4A is a flow chart illustrating an exemplary method of operating a DCO, DCOs of FIGS. 1A, 1B, and 1C.

FIG. 4A shows a flow chart illustrating a method 400 of operating an oscillator, for example the oscillator 100 of FIG. 1 and the oscillator 150 of FIG. 2. The method 400 may be performed in a wireless communication device. The method 400 begins, or is called to operate, with a block 402.

In a block 404, an oscillator operates in the NMOS mode. As an example, it may be beneficial to operate in the NMOS mode when operating above the lower end of the frequency tuning range, for example but not limited to, when operating above 10% of the lower end of the frequency tuning range where the low end of the frequency tuning range may be the frequency below which the oscillator cannot oscillate as all available capacitance has been employed in the LC tank, for example an LC tank associated with the resonator 106 and/or the resonator 154. As an example of the NMOS mode for the oscillator 100, a first switch, for example the first switch 110a, and a second switch, for example the second switch 110b, may be open and a first n-type transistor, for example the first n-type transistor 104a, and a second n-type transistor, for example the second n-type transistor 104b, may operate as active components, while a first p-type transistor, for example the first p-type transistor 102a, and a second p-type transistor, for example the second p-type transistor 102b, are passive components. As an example of the NMOS mode for the oscillator 150, the NMOS mode may be achieved by opening the switches 110a, 110b, and 162, while closing the switch 166, and forcing the transistor 164 drain voltage to Vdd.

In a block 406, the oscillator of the block 404 operates in the CMOS mode. As an example, it may be beneficial to operate in the CMOS mode when operating in the lower end of the frequency tuning range. In the CMOS mode, the first and second switches of the block 404 may be closed and the first n-type transistor, the second n-type transistor, the first p-type transistor, and the second p-type transistor, of the block 204 may operate as active components. As an example of the CMOS mode for the oscillator 150, the CMOS mode may be achieved by closing the switches 110a, 110b, and 162, while opening the switch 166, and providing the line 112 as the non-inverting input of the operational amplifier 160. In a block 408, the method 400 terminates.

An efficient operation and a wide tuning range are achieved by switching between the NMOS mode only and the CMOS mode. In particular, power savings may be realized through operation in the CMOS mode. In some embodiments, only one reconfigurable grouping of active components, as described herein, may be required to realize a desired wide tuning range while providing configurability related to power efficiency and phase noise reduction. A wide tuning range may be realized through a relatively fixed capacitance associated with the active device size. In addition to other advantages of operating in the CMOS mode, the start-up gain may be increased, which may lead to further gains in tuning range.

Operating in the NMOS mode, in a system that also allows for the CMOS mode as illustrated herein, may allow the oscillator to increase current and to meet stringent phase noise requirements with the same oscillator components and the same power supply. Operating in the NMOS mode may allow the oscillator to efficiently reach maximum frequencies. Operating in the CMOS mode may allow for power savings when operating in lower frequencies.

The inductor 108 is a $2^{nd}$ harmonic inductor. When operating in the NMOS mode, the inductor 108 may lead to a reduction in flicker noise contribution at lower frequency offsets. When operating in the CMOS mode, the single side symmetry properties active components may lead to a reduction in flicker noise contribution from the active components.

Referring again to FIG. 4A, the method 400 may include operating a biasing circuit, for example the biasing circuit 152, in which the biasing for the NMOS mode of the block 404 differs from the biasing for the CMOS mode of the block 406. For example, the biasing for the block 404 may include biasing in which a switch, such as the switch 166, is closed to make a transistor, for example the transistor 168, the amplifier 160 output stage. Many supply and biasing configurations are possible. For example, when operating in the CMOS mode, the oscillator 150 may be biased from a 2.1 volt supply, and while operating in the NMOS mode, the oscillator 150 may be biased from a 1.3 volt or a 2.1 volt supply. The choice of supply voltage for the biasing system 152 may be related to the phase noise requirements. For example, a 2.1 volt supply for the NMOS mode may allow the oscillator 150 to meet stringent phase noise requirements while minimizing the influence of the transistors 102a and 102b.

The CMOS mode of the block 406 may include employing an operational amplifier and a transistor in series, for example the amplifier 160 and the transistor 164, where the drain of the transistor is employed as the output stage of the biasing circuit 152. Feedback may be taken from a tap of the resonator 154 inductor, which may be the common mode point of the resonator 154 inductor. In some embodiments, feedback may also be taken from the line 112.

FIG. 4B shows a second flow chart illustrating a second exemplary method 420 of operating an oscillator, for example the oscillator 100 of FIG. 1 and the oscillator 150 of FIG. 2. The method 420 may be performed in a wireless communication device. The method 420 begins, or is called to operate, with a block 422. In the block 406, the oscillator of operates in the CMOS mode. In a block 424, it is determined whether the wireless system and/or conditions calls for operation in a higher frequency band of the oscillator tuning range, for example band 308 of range 302 (see FIG. 3). While operation in the higher frequency band is desired, the method 420 moves to the block 404 (see FIG. 4A) and operates in the NMOS mode. If operation in the higher frequency band of the oscillator tuning range is not desired, the method 420 moves to a block 426.

In the block 426, it is determined whether the wireless system and/or conditions call for operation in a lower frequency band of the oscillator tuning range, for example the band 304 of the range 302. While operation in the lower frequency band is desired, the method 420 moves to the block 406 (see FIG. 4A) and operates in the CMOS mode.

If operation in the higher and/or the lower band of the oscillator tuning range is not desired, the method 420 moves to a block 428.

In the block 428, it is determined whether the wireless system and/or conditions calls for operation in a best noise mode, for example within the band 306 of the range 302, during times or conditions when low noise is desired. While operation in the best noise mode is desired, the method 420 moves to the block 404 and operates in the NMOS mode. If a best noise mode is not desired, the method 420 moves to the block 406 where power consumption may be minimized.

Figure 4C:
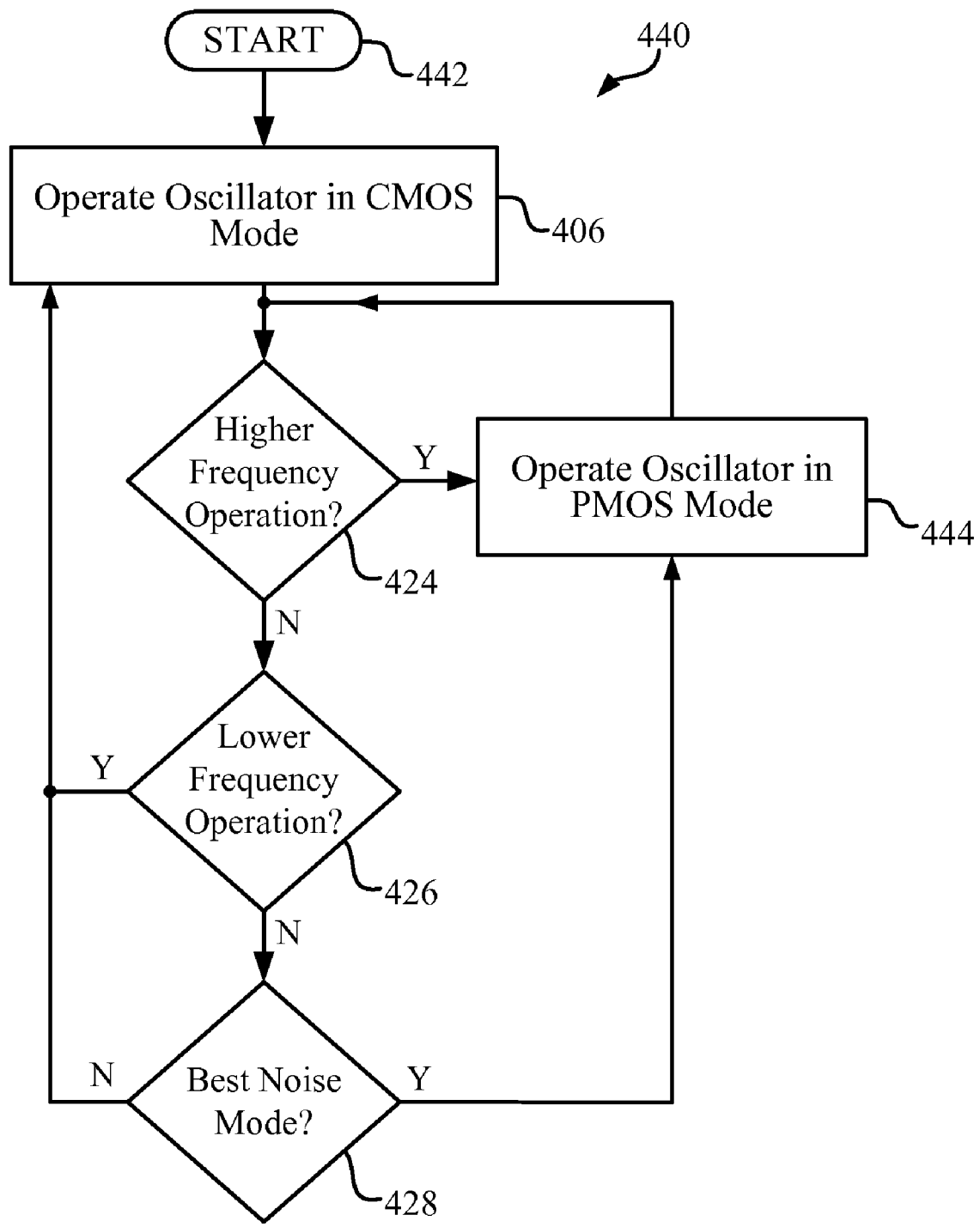
FIG. 4C is a flow chart illustrating a further exemplary method of operating a DCO, DCOs of FIGS. 1A, 1B, and 1C.

FIG. 4C shows a third flow chart illustrating a further exemplary method 420 of operating an oscillator, for example the oscillator 176 of FIG. 1C. The method 440 may be performed in a wireless communication device. The method 440 begins, or is called to operate, with a block 442. In the block 406, the oscillator operates in the CMOS mode. As an example of the CMOS mode for the oscillator 176, the CMOS mode may be achieved by closing the switches 182a, and 182b while opening the switches 184 and 186.

In the block 424, it is determined whether the wireless system and/or conditions calls for operation in the higher frequency band of the oscillator tuning range, for example the band 308 of the range 302 (see FIG. 3). While operation in the higher frequency band is desired, the method 420 moves to a block 444 and operates in the PMOS mode. As an example of the PMOS mode for the oscillator 176, the PMOS mode is achieved by opening the switches 182a, and 182b while closing the switches 184 and 186. If operation in the higher frequency band of the oscillator tuning range is not desired, the method 440 moves to the block 426. The block 426 operates as described in regard to FIG. 4B.

In the block 428, it is determined whether the wireless system and/or conditions calls for operation in the best noise mode, during times or conditions when low noise is desired. While operation in the best noise mode is desired, the method 440 moves to the block 444 and operates in the PMOS mode. If the best noise mode is not desired, the method 440 moves to the block 406 where power consumption may be minimized.

The functionality, operations and architecture depicted by the blocks of the methods illustrated herein may be, at least partially, implemented using modules, segments, and/or portions of software and/or firmware code. The modules, segments, and/or portions of code include one or more executable instructions for implementing the specified logical function(s). In some implementations, the functions noted in the blocks may occur in a different order than that shown. For example, two blocks shown in succession in FIG. 4A-4C may be executed concurrently or the blocks may sometimes be executed in another order, depending upon the functionality involved.

Those of skill would further appreciate that the various illustrative logical blocks, modules, circuits, and algorithm steps described in connection with the embodiments disclosed herein may, at least in part, be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

In one or more exemplary embodiments, the functions described may be, at least in part, implemented in hardware, software, firmware, or any combination thereof. If implemented in software, the functions may be stored on or transmitted over as instructions or code on one or more computer-readable media. Computer-readable medium includes both computer storage medium and communication medium, including any medium that facilitates transfer of a computer program from one place to another. A storage medium may be any available medium that can be accessed by a computer. By way of example, and not limitation, such computer-readable medium can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable medium.

The above description of the disclosed embodiments is provided to enable any person skilled in the art to make or use that which is defined by the appended claims. The following claims are not intended to be limited to the disclosed embodiments. Other embodiments and modifications will readily occur to those of ordinary skill in the art in view of these teachings. Therefore, the following claims are intended to cover all such embodiments and modifications when viewed in conjunction with the above specification and accompanying drawings.

What is claimed is:

1. An apparatus, comprising:
a resonator having a first terminal and a second terminal;
a first p-type transistor having a first source, a first gate, and a first drain, the first gate electrically connected to the second terminal, and the first drain electrically connected to the first terminal through a first switch;
a second p-type transistor having a second source, a second gate, and a second drain, the second source electrically connected to the first source, the second gate electrically connected to the first terminal, and the second drain electrically connected to the second terminal through a second switch;
a first n-type transistor having a third source, a third gate, and a third drain, the third gate electrically connected to the second terminal, the third drain electrically connected to the first terminal through a first connection that does not include a switch; and
a second n-type transistor having a fourth source, a fourth gate, and a fourth drain, the fourth gate electrically connected to the first terminal, the fourth drain electrically connected to the second terminal through a second connection that does not include a switch, the fourth source electrically connected to the third source, and the third source and the fourth source electrically connected to ground through an inductor.

2. The apparatus of claim 1, wherein the resonator includes a transformer with a plurality of ports, wherein a capacitor is electrically connected to one or more ports.

3. The apparatus of claim 1, wherein the resonator is an LC tank.

4. The apparatus of claim 1, wherein the resonator is transformer based.

5. The apparatus of claim 1, wherein the apparatus is configured to operate in an NMOS mode when the first switch and the second switch are open.

6. The apparatus of claim 1, wherein the apparatus is configured to operate in a CMOS mode when the first switch and the second switch are closed.

7. The apparatus of claim 1, further including a bias circuit, wherein the bias circuit is electrically connected to the first source and the second source.

8. The apparatus of claim 7, wherein the bias circuit includes an operational amplifier, wherein a non-inverting input to the operational amplifier is electrically connected to the first source.

9. The apparatus of claim 7, wherein the bias circuit includes an operational amplifier, wherein a non-inverting input to the operational amplifier is electrically connected Vreg_Ltap.

10. The apparatus of claim 1, wherein the first switch and/or the second switch includes a transistor and a resistor.

11. An apparatus, comprising:
a resonator having a first terminal and a second terminal;
a first p-type transistor having a first source, a first gate, and a first drain, the first gate electrically connected to the second terminal, and the first drain electrically connected to the first terminal;
a second p-type transistor having a second source, a second gate, and a second drain, the second source electrically connected to the first source, the second gate electrically connected to the first terminal, and the second drain electrically connected to the second terminal;
a first n-type transistor having a third source, a third gate, and a third drain, the third gate electrically connected to the second terminal, the third drain electrically connected to the first terminal through a first switch; and
a second n-type transistor having a fourth source, a fourth gate, and a fourth drain, the fourth gate electrically connected to the first terminal, the fourth drain electrically connected to the second terminal through a second switch, and the fourth source electrically connected to the third source, wherein the fourth source and the third source are electrically connected to ground through a third switch.

12. The apparatus of claim 11, wherein the resonator includes a transformer with a plurality of ports, wherein a capacitor is electrically connected to one or more ports.

13. The apparatus of claim 11, wherein the resonator is an LC tank.

14. The apparatus of claim 11, wherein the resonator is transformer based.

15. The apparatus of claim 11, wherein the apparatus is configured to operate in a PMOS mode when the first switch and the second switch are open, and the third switch is closed.

16. The apparatus of claim 11, wherein the apparatus is configured to operate in a CMOS mode when the first switch and the second switch are closed, and the third switch is open.

17. The apparatus of claim 11, wherein the first and second sources are electrically connected to an inductor.

18. A method of operating an oscillator having a resonator, comprising:

operating the oscillator with two p-type transistors inactive and two n-type transistors active when the oscillator is called upon to produce frequencies in a higher range; and operating the oscillator with the two p-type transistors active and the two n-type transistors active when the oscillator is called upon to produce frequencies in a lower range;

wherein the first of the two p-type transistors has a first drain, and the second of the two p-type transistors has a second drain, and the first drain is disconnected from a first terminal of the resonator when the first p-type transistor is inactive, and the second drain is disconnected from a second terminal of the resonator when the second p-type transistor is inactive, and wherein sources of the two n-type transistors are electrically connected to ground through either a switch or an inductor.

19. The method of claim 18, wherein the resonator includes a transformer with a plurality of ports, wherein a capacitor is electrically connected to one or more ports.

20. The method of claim 18, wherein the resonator is an LC tank.

21. The method of claim 18, wherein the resonator is transformer based.

22. The method of claim 18, wherein the first drain is disconnected from the first terminal by opening a switch that is connected between the first drain and the first terminal.

23. The method of claim 18, further including operating a bias circuit, wherein the first of the two p-type transistors has a first source, and the second of the two p-type transistors has a second source and the bias circuit is electrically connected to the first source and the second source.

24. The method of claim 23, wherein the bias circuit includes an operational amplifier, wherein a non-inverting input to the operational amplifier is electrically connected to the first source.

25. The method of claim 23, wherein the bias circuit includes an operational amplifier, wherein a non-inverting input to the operational amplifier is electrically connected Vreg_Ltap.

26. The method of claim 18, further including operating the oscillator with two p-type transistors inactive and two n-type transistors active when the oscillator is called upon to minimize noise.

27. An apparatus, comprising:

means for operating two n-type transistors and two p-type transistors as active components in an oscillator when the oscillator is called upon to produce frequencies in a lower frequency range;

means for operating the two n-type transistors as active components while the p-type transistors are disconnected from a resonator of the oscillator when the oscillator is called upon to produce frequencies in a higher frequency range; and means for operating the two n-type transistors as active components while the p-type transistors are disconnected from the resonator when the oscillator is called upon to minimize phase noise while producing frequencies in the lower frequency range, wherein sources of the two n-type transistors are electrically connected to ground through either a switch or an inductor.

* * * * *